United States Patent
Cheung et al.

(10) Patent No.: US 7,541,890 B2
(45) Date of Patent: Jun. 2, 2009

(54) QUASI ACTIVE MIMIC CIRCULATOR

(75) Inventors: Siu K. Cheung, Storrs, CT (US);
Willam H. Weedon, III, Warwick, RI (US); Timothy Philip Halloran, Watertown, MA (US)

(73) Assignee: Applied Radar, Inc., North Kingstown, RI (US)

( * ) Notice: Subject to any disclaimer, the term of this patent is extended or adjusted under 35 U.S.C. 154(b) by 70 days.

(21) Appl. No.: 11/978,252

(22) Filed: Oct. 29, 2007

(65) Prior Publication Data

US 2009/0108954 A1    Apr. 30, 2009

(51) Int. Cl.
*H03H 11/02*    (2006.01)
(52) U.S. Cl. .................................. 333/117; 333/24 R
(58) Field of Classification Search ............... 333/1.1, 333/24.2, 24.3, 117, 100, 132, 134, 24 R; 455/137, 139, 106
See application file for complete search history.

(56) References Cited

U.S. PATENT DOCUMENTS

| | | | |
|---|---|---|---|
| 4,679,010 A * | 7/1987 | Bahl | ........................ 333/109 |
| 4,682,176 A | 7/1987 | Jones | |
| 4,801,901 A | 1/1989 | Ayasli | |
| 4,857,935 A | 8/1989 | Bates | |
| 4,908,820 A | 3/1990 | Ayasli | |
| 5,046,155 A | 9/1991 | Beyer et al. | |
| 5,223,805 A | 6/1993 | Talcott et al. | |
| 6,760,572 B2 | 7/2004 | Noori | |
| 2006/0256002 A1 * | 11/2006 | Macdonald | ................. 342/175 |

* cited by examiner

*Primary Examiner*—Stephen E Jones

(57) ABSTRACT

A circulator capable of simultaneous transmit and receive operations, high frequency, and high isolation and broadband performance comprising: an antenna port; a transmission port; a receiving port; wherein each port is connected to a 90 degree combiner/divider for splitting an input signal into two output components, the said output components have a ninety degrees relative phase difference to each other; each of said 90 degree combiner/dividers in addition to the connection to the above mentioned ports has at least two output connections each of which are connected to a Y-junction and if a fourth connection, said fourth connection is attached to a matching load circuit; this arrangement of circuits allows the portion of the phase shifted signals from the transmit port to enter the antenna 90 degree combiner/divider and be enhanced at the antenna port, while the rest of the signal enters the receive 90 degree combiner/divider and are phased cancelled; said arrangement allows the signals from the antenna port 90 degree combiner/divider to combine in phase at the receive port.

13 Claims, 14 Drawing Sheets

QUASI ACTIVE MIMIC CIRCULATOR

FIELD OF THE INVENTION

The invention relates to the field of circulators including 90-degree power dividers or combiners, and/or unilateral devices for simultaneous transmit and receive operations. The invention related to methods of constructing circulators for radar and communication applications. The invention is suitable for high isolation operation between transmit and receive signals with simultaneously transmit and receive capabilities. Moreover, the invention is suitable for MMIC integration with other active components to construct system-on-chip (SOC) transceiver for simultaneous transmit and receive applications.

BACKGROUND OF THE INVENTION

Circulators are three-terminal devices which pass signal inputs from one port to the next in a rotational fashion (either clockwise or counterclockwise) with allowing the signal inputs to pass in the opposite direction. Circulators are suitable for any radio frequency (RF) applications including communications, cell phones, radar, phased array radar and electronic countermeasures (ECM). A typical arrangement for a circulator is for the antenna to be designated as port 1, the receiver, port 2 and the transmitter as port 3. Thus, a signal from the antenna will travel to the receiver, a signal from the receiver to the transmitter and the transmitter to the antenna. Some of the transmitter signal will carry over to the receiver.

During transmission, the circulator isolates the sensitive receiver from the large transmitter signal. Since the received signal travels from the antenna to the receiver, it is isolated from the transmitter. The circulator causes a loss in the outgoing signal from the transmitter amplifier. This signal loss reduces the range at which radar can detect objects, or that a wireless device can communicate. On reception, the circulator also causes a loss in the receiver path. Because this loss is occurs before the low-noise amplifiers, the loss value adds to the noise value of the receiver path, degrading the magnitude of the minimal detection signal.

Circulators have a certain size and weight that is determined by the frequency of use. When the circulator is used in a spaced-base phased array application, the total weight of the circulator is large. Circulator architectures impart sacrifices to both output power and the noise figure. In general, circulators operate with high noise figures, low output signal levels, and are heavy with large profiles. These and other disadvantages are solved or reduced with using this new device.

SUMMARY OF THE INVENTION

An object of this invention is to provide a quasi circulator using phase cancellation and combination to prevent transmission energy from reaching the receive port and to preserve energy at the antenna port, respectively.

Another object of this invention is to provide circulator function on small sized integrated circuit or mimic chip.

Another object of this invention is to provide a circulator that operates with high isolation between the transmit and receive ports for wide band operation.

Another object of this invention is to provide a circulator with simultaneously transmit and receive operations.

Another objective of this invention is to provide a circulator that operates with wider bandwidth at higher frequency.

This device is the result of the realization that a circulator can operate with higher bandwidth and frequency, be compact and act as a system on a chip for size and weight reduction.

This invention features a circulator, which consists of three 90-degree hybrids either passively or actively implemented, and/or other passive and/or active components such as: amplification elements, diodes, hybrids, attenuator, phase shifter and field effective transistors, with capabilities of MMIC integration and simultaneous transmit and receive operations. The proposed ninety degree hybrid ring could be implemented either by active devices or passive devices or by both. The invention is a three or more port device, and specifically in this application, it is a three port device in which the antenna port is placed between a transmit port and a receive port as shown in FIG. 1. The circulator has input signal from the transmit port circulated combined in phase at the antenna port while the rest of the transmit signals are phase destructively cancelled at the receive port to achieve high isolation between the transmit and receive ports. As a result the circulator is capable of high isolation performance between the transmit and receive ports and the circulator is capable of simultaneous transmit and receive capabilities.

DETAILED DESCRIPTION OF THE PREFERRED EMBODIMENT

Figure one shows a basic design of the invention with a transmit port 1, antenna port 2, and receive port 3. Each port is connected to a 90 degree combiner/divider, 4T, 4A, and 4R. Balancing the input to the 90 degree combiner/divider is a matching load circuit, 5. Each combiner/divider is connected to two Y-junctions A, 7, and B, 8.

Figure 1:
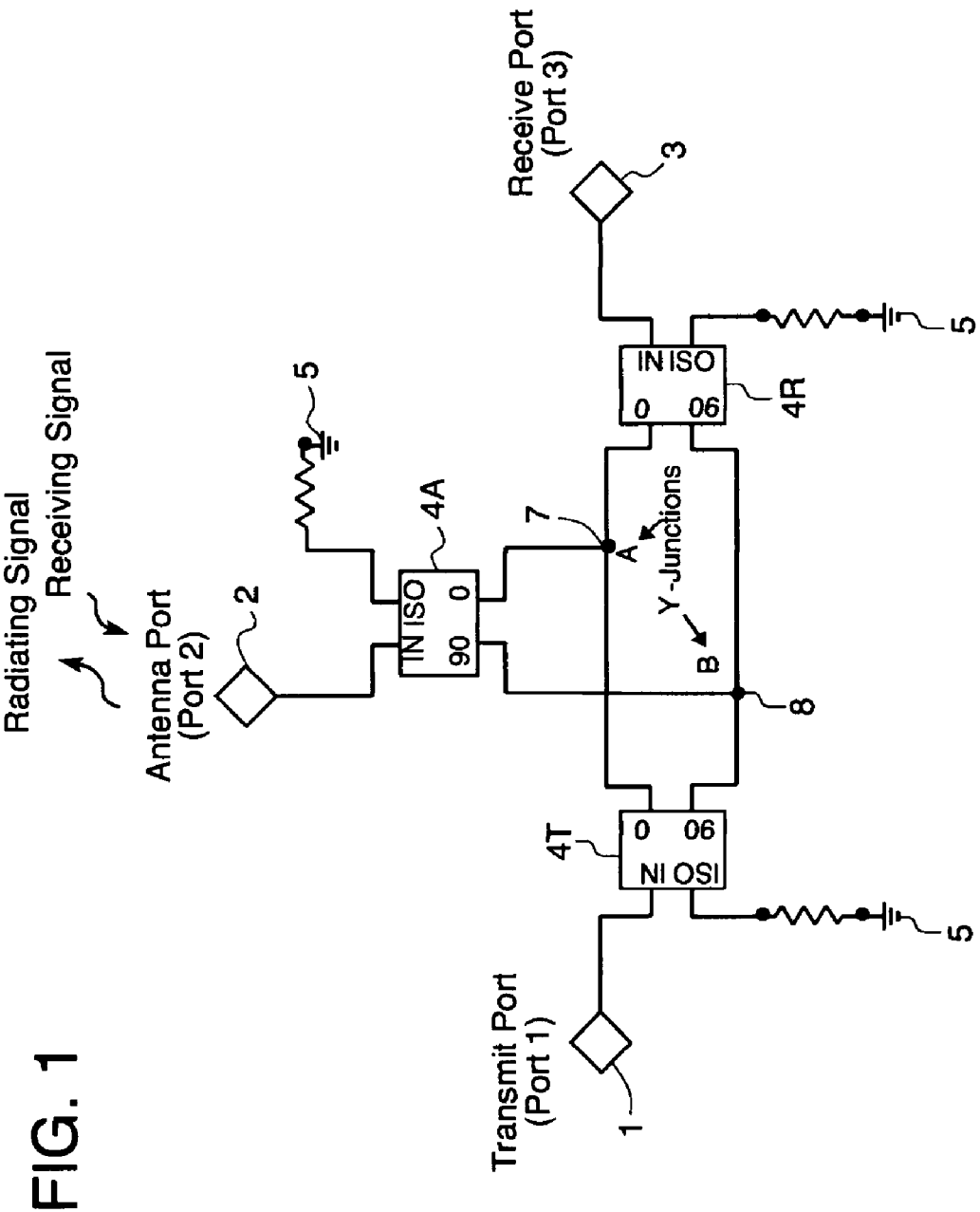
FIG. 1 is a rendition of the basic circulating device showing the transmit, antenna and receive ports and their associated connections and 90 degree combiner/dividers.
Figure 2A:
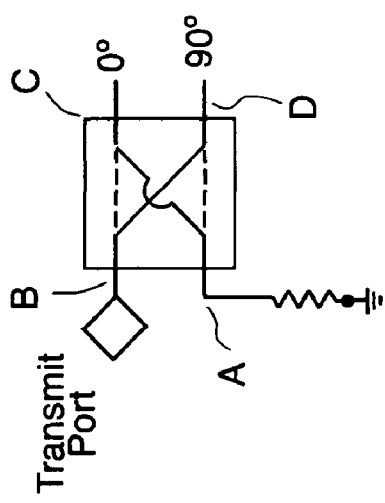
FIG. 2A depicts phase offset signals leaving the transmit port.

FIGS. 2 A, B, and C, show the arrangement of leads to each of the 4 lead 90 degree combiner/dividers. Note that the leads on the ninety degree combiner/divider are labeled A, B, C, and D. The arrangement of the matching load circuit and the port circuit are the same for the antenna and receive port combiner/dividers.

Transmissions enter the 90 degree combiner/divider 4T, and are split. The two new phases have 90 degree phase difference. Hereinafter, these two phases will be referred to as the 0° relative phase offset and a 90° relative phase offset. See FIG. 2A. The 90° relative offset phase signal leaves the ninety degree combiner/divider at the "D" position and splits at Y-junction B, 8. The 0° relative offset phase signal leaves the ninety degree combiner/divider at the "C" position and splits at Y-junction A, 7.

Figure 2C:
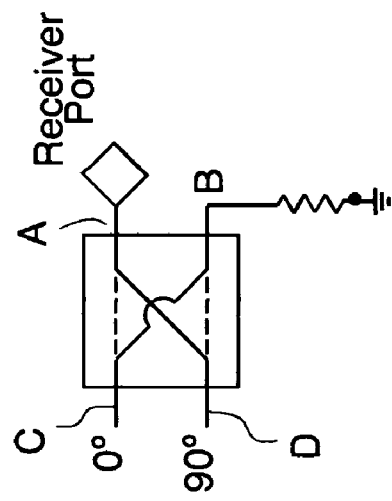
FIG. 2C depicts the 0° and 90° phase offset signals from the transmit port entering the receive port.
Figure 2B:
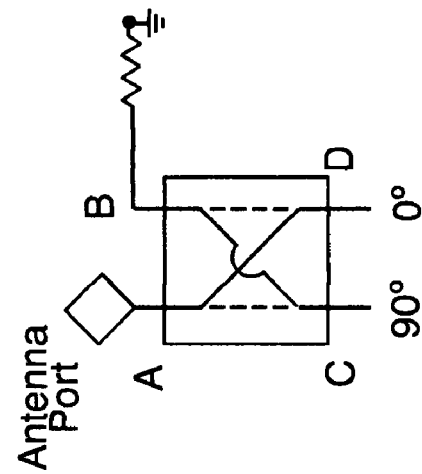
FIG. 2B depicts the 0° and 90° phase offset signals from the transmit port entering the antenna port.

FIGS. 2B and 2C show where the relative degree offset signals from the transmit 90 degree combiner/divider enter the 90 degree combiner/dividers for the antenna port (2B) and receive port (2C) . . . . The Y-junctions enable the signals from the transmission port to switch leads for instance, a ninety degree phase offset signal from transmit 90 degree combiner/ divider will leave lead "D", split at Y-junction B, 8, and will go to lead "D" on the receive port, but go to lead "C" on the antenna port. Likewise a 0 degree phase shift signal will exit the transmit 90 degree combiner/divider at lead "C" and split at Y-junction A, 7, and go to lead "C" on the receive 90 degree combiner/divider and to lead "D" on the antenna 90 degree combiner/divider.

At the antenna port, the 90° relative phase offset signal transmits without change to the "A" position to the antenna port while the portion split is offset an additional 90° having a total offset of 180° and exits the ninety degree combiner/ divider at the "B" or matching load circuit position. The 0° relative phase offset signal enters the antenna ninety degree combiner/divider at the "D" position. This signal passes without change to the "B" position to the matching load circuit. It meets with the 180° relative phase offset signal and is cancelled out. The other portion of the 0° relative phase offset signal is divided to a 90° relative phase offset signal and exits the ninety degree combiner/divider at the "A" position. Thus, two 90° phase offset signals meet and combine at the antenna port. FIG. 2C shows how the signals from the transmit ninety degree combiner/divider enter the receive port. In contrast to the antenna port, the 0° relative phase offset signal enters the receive ninety degree combiner/divider at the "C" position. This signal is unchanged when passing to the "A" antenna port position. The other portion is offset by a relative 90° and exits through the "B" matching load circuit. The 90° relative phase signal is offset by another 90° and becomes a 180° relative phase offset. When this 180° relative phase offset signal meets with the 0° relative phase offset signal at the "A" position, these signals cancel out.

Figure 3B:
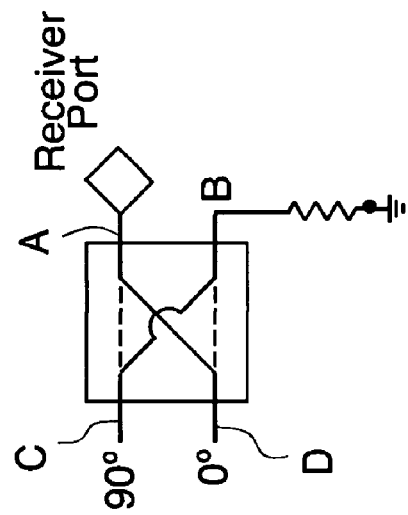
FIG. 3B shows how the 0° and 90° phase offset signals from the antenna port enter the receive port.
Figure 3A:
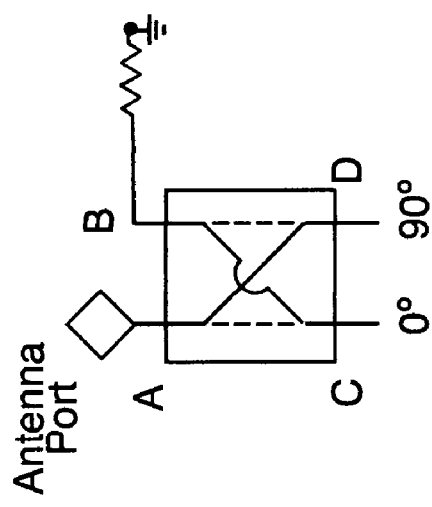
FIG. 3A depicts the arrangement of phase offset signals leaving the antenna port.

FIGS. 3A and 3B show the transmission paths from the antenna port to the receive port. As with the transmission port, a portion of the signal passes through the A position of the ninety degree combiner/divider unchanged to the C position. From that point it travels to Y-junction B, 8, to the receive ninety degree combiner/divider at the D position. At the D position, the part of the 0° phase signal transfers unchanged to the B position and to the matching load circuit. The other portion of the signal is transferred to the A position and is converted to a relative 90° in phase offset. The other portion of the signal emanating from the antenna port ninety degree combiner/divider is converted to a relative 90° in phase offset. This signal passes through the D portion of the antenna ninety degree combiner/divider to Y-junction A, 7, to position C of the receive ninety degree combiner/divider. This signal passes to the A portion and mates with the relative 90° phase signal from the D portion of the same combiner/divider.

Thus, the relative position of the major components of this system allow for the transmit signal to phase cancelled at the receive port ninety degree combiner/divider while the signals from the antenna port are combined, thereby eliminating any transmission interferences at the receive port.

Figure 4:
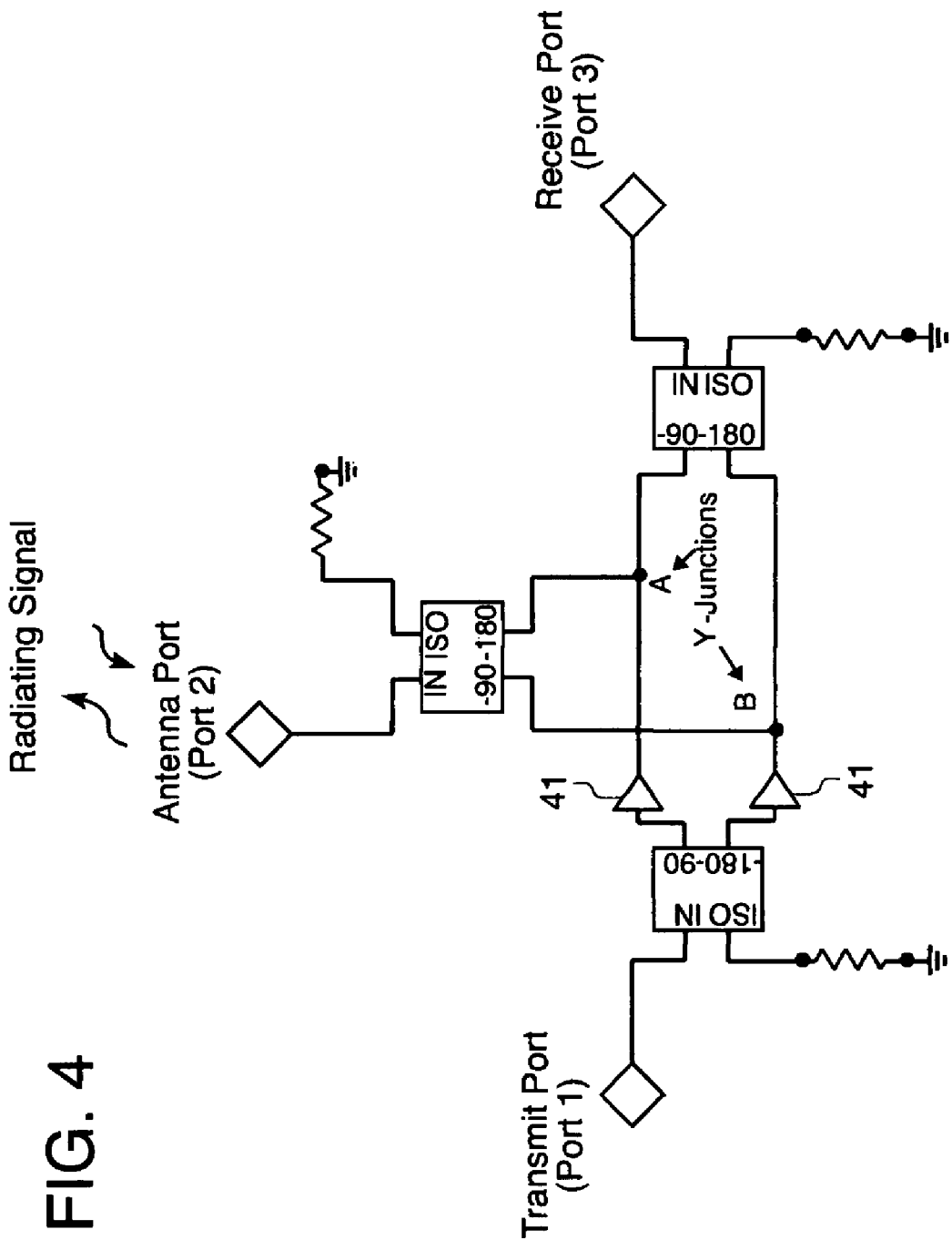
FIG. 4 depicts the basic circulator with unilateral devices added after the transmit port 90 degree combiner/divider.

FIG. 4 shows the device with unilateral devices 41 which are used to amplify the transmit signal and to prevent the receive signal from the antenna port from entering the transmit port.

Figure 5:
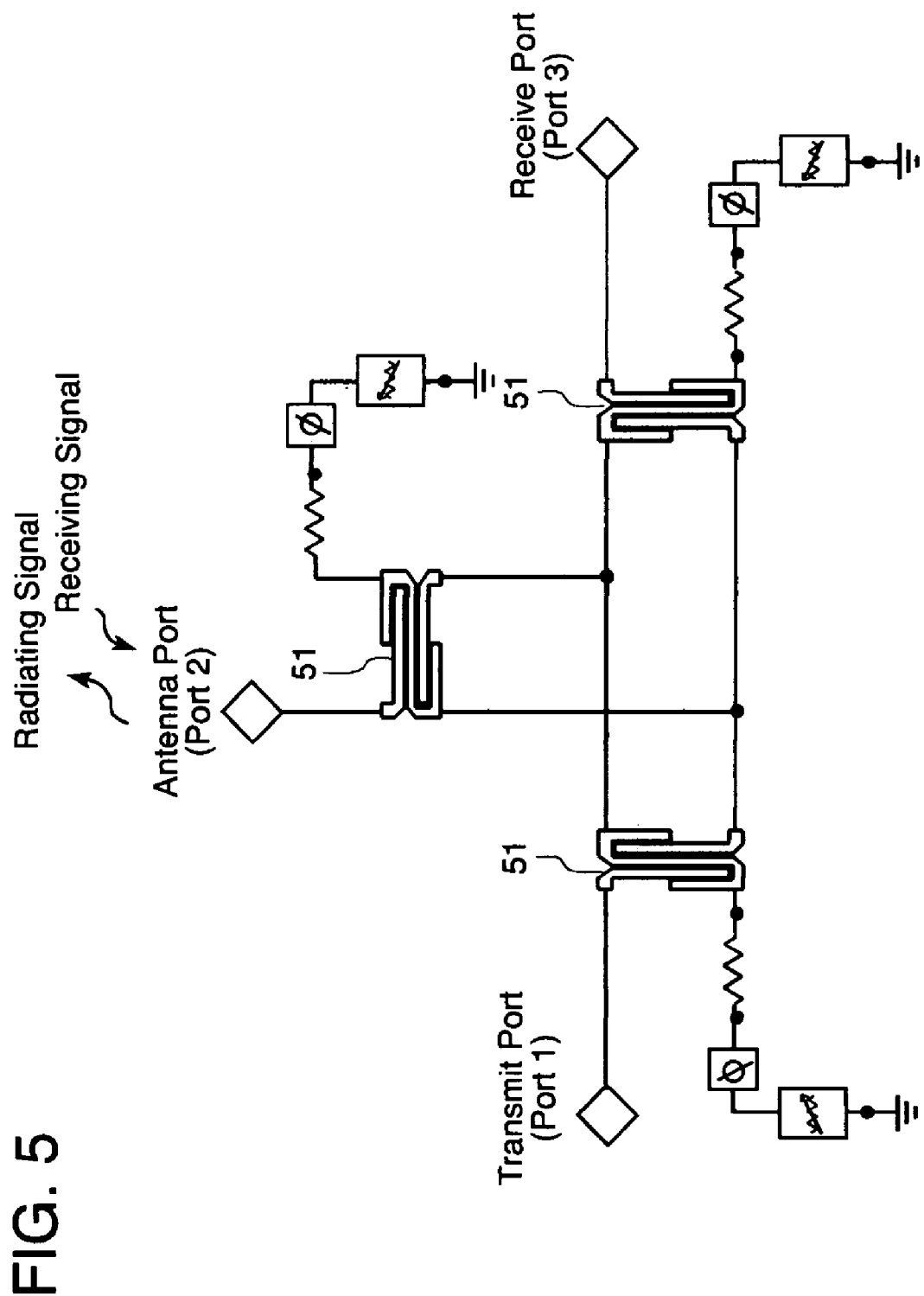
FIG. 5 depicts the device with Lange couplers as the 90 degree divider/combiners.

FIG. 5 is a depiction of the device with Lange couplers, 51, substituted for the ninety degree combiner/dividers. The function is similar between the Lange couplers and the ninety degree combiner/dividers.

Figure 6:
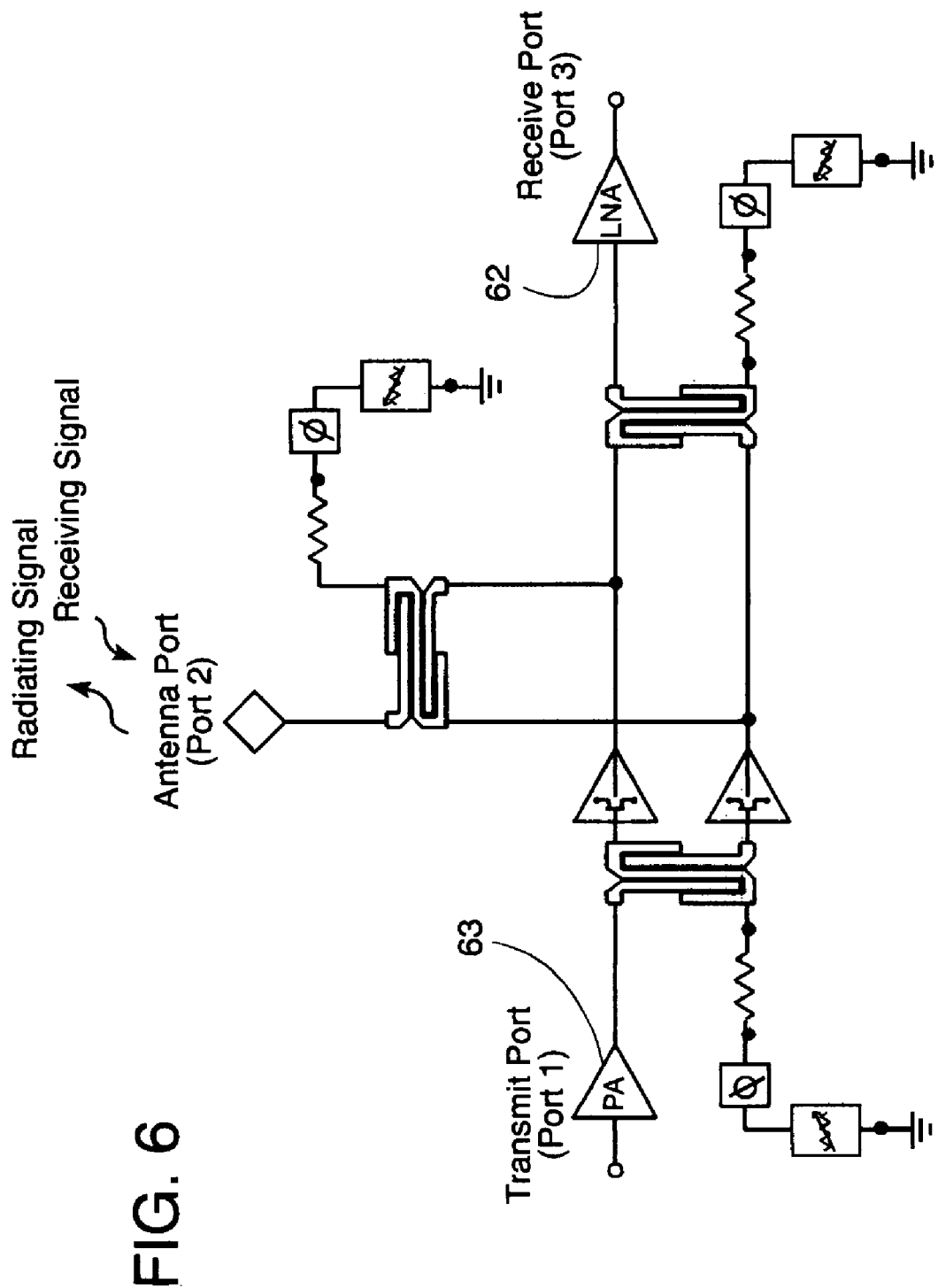
FIG. 6 is a rendition of FIG. 5 with a power amplifier added to the transmit port and a low noise amplifier added to the receive port.

FIG. 6 is another embodiment of the device with an amplifier 63, set before the transmit port Lange coupler. This serves to boost the transmit signal to the antenna port. After the receive port Lange coupler, but before the receive port, a low noise amplifier 62, is set to amplify the signals from the antenna.

Figure 7:
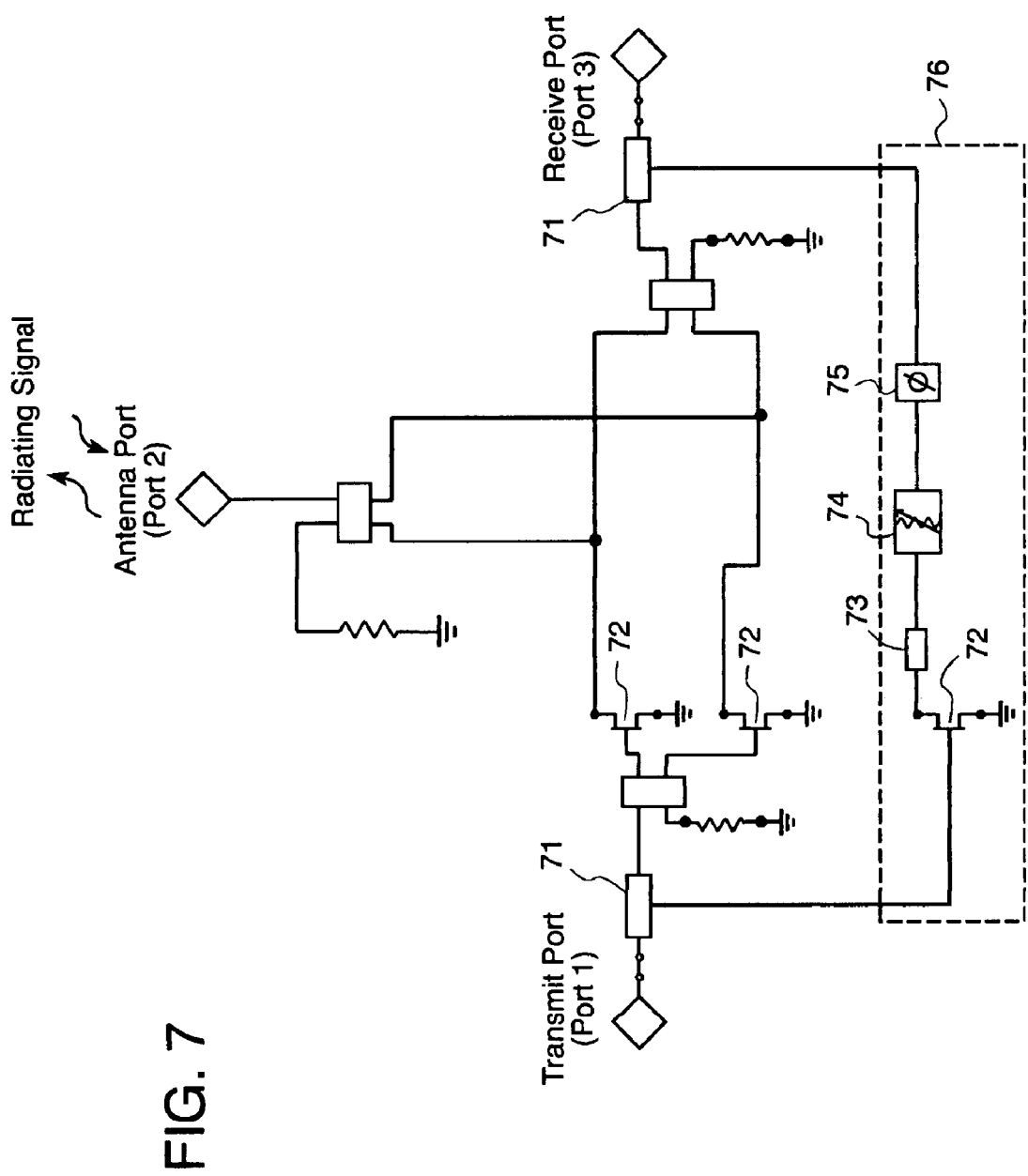
FIG. 7 is the basic device with the addition of a feed forward circuit and unilateral devices with application.

FIG. 7 is a depiction of the device with an additional feed forward cancellation circuit, 76. Additional changes include unilateral elements with amplification, 72, leading from the transmit port ninety degree combiner/divider. The feed forward cancellation circuit is connected to the device by two couplers, 71, one of which are located between the transmit port and the transmit ninety degree combiner/divider and the other is located between the receive port and the receive ninety degree combiner/divider. Located in order on the feed forward cancellation circuit are another unilateral element with amplification, 72, a delay line 73, an adjustable attenuator, 74 and adjustable phase shifter, 75. This feed forward cancellation circuit is designed to cancel out any residual signals that remain from the phase cancellation properties of the device and provide further isolation of the transmit port from the receive port.

Figure 8:
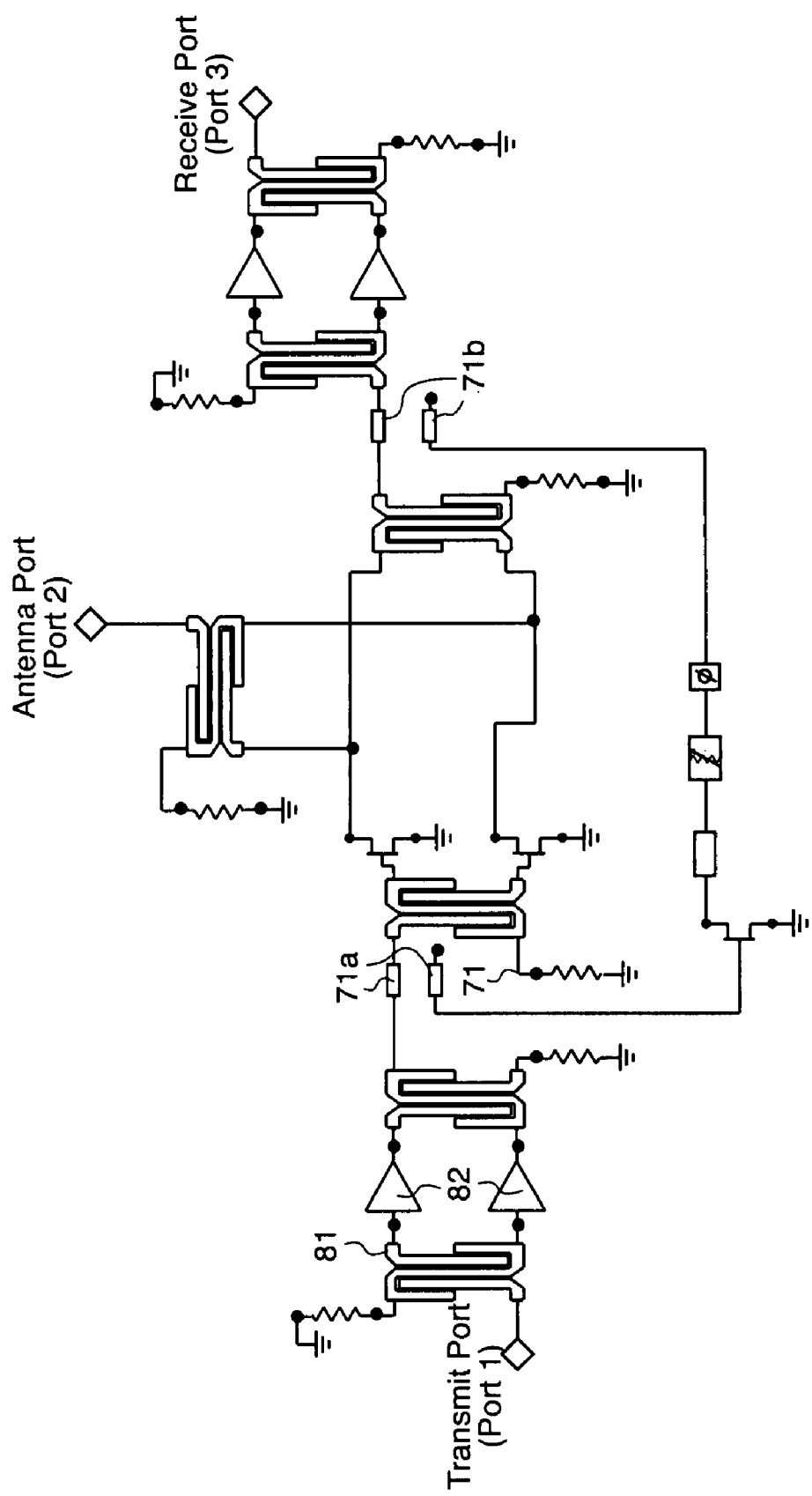
FIG. 8 is an amplification of FIG. 7 with additional Lange coupers to enhance performance.
Figure 10:
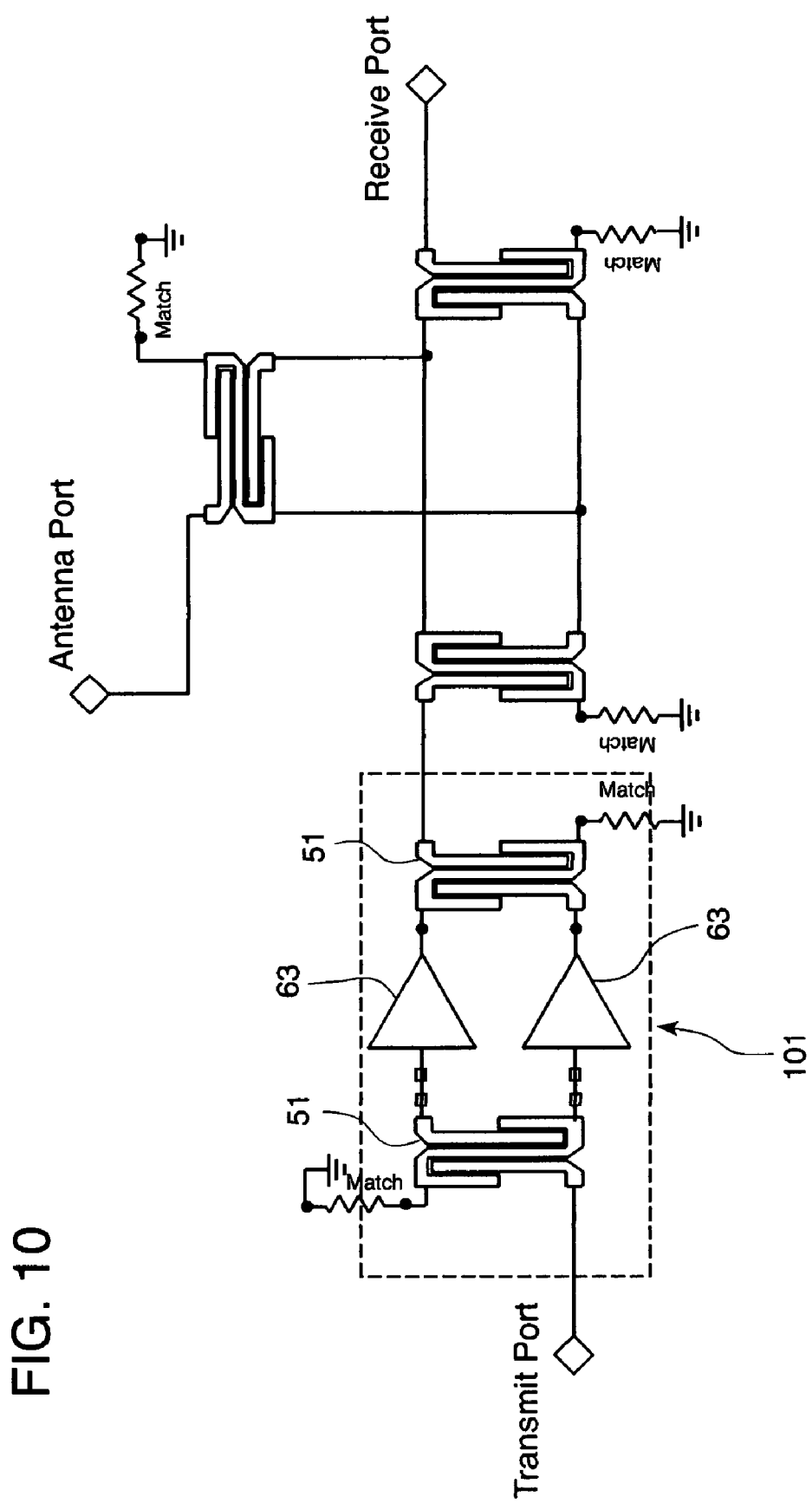
FIG. 10 is a rendition of FIG. 5 with a balance amplifier section added to the transmit port.

FIG. 8 shows the device incorporated in a system on a chip. In this embodiment, the transmit and receive ports are enhanced with two additional Lange coupler. One 81, is placed downstream from the transmit port and the signal is split. The two signals each pass through power amplifiers 82, and then to another Lange coupler where part of the amplified input signal is phase combined. The signal then goes through a coupler 71 and then goes either through the feed forward cancellation line or through the 90 degree combiner/divider or Lange coupler as described above. On the receive end of this system, the signals from the couplers 71b, are passed through an additional Lange coupler 83, then through balance low noise amplifiers 84 before finally passing through the final receive Lange coupler for final phase enhancement and noise cancellation. FIG. 10 is another embodiment the device with Lange couplers acting as 90 degree combiner/dividers in the circulator portion and a balanced amplifier section at the transmit port. The balance amplifier portion is comprised of two additional Lange couplers and two power amplifiers to prevent stray signals from the antenna portion from interfering with the transmit portion and to provide more strength to the transmission signal.

Figure 11:
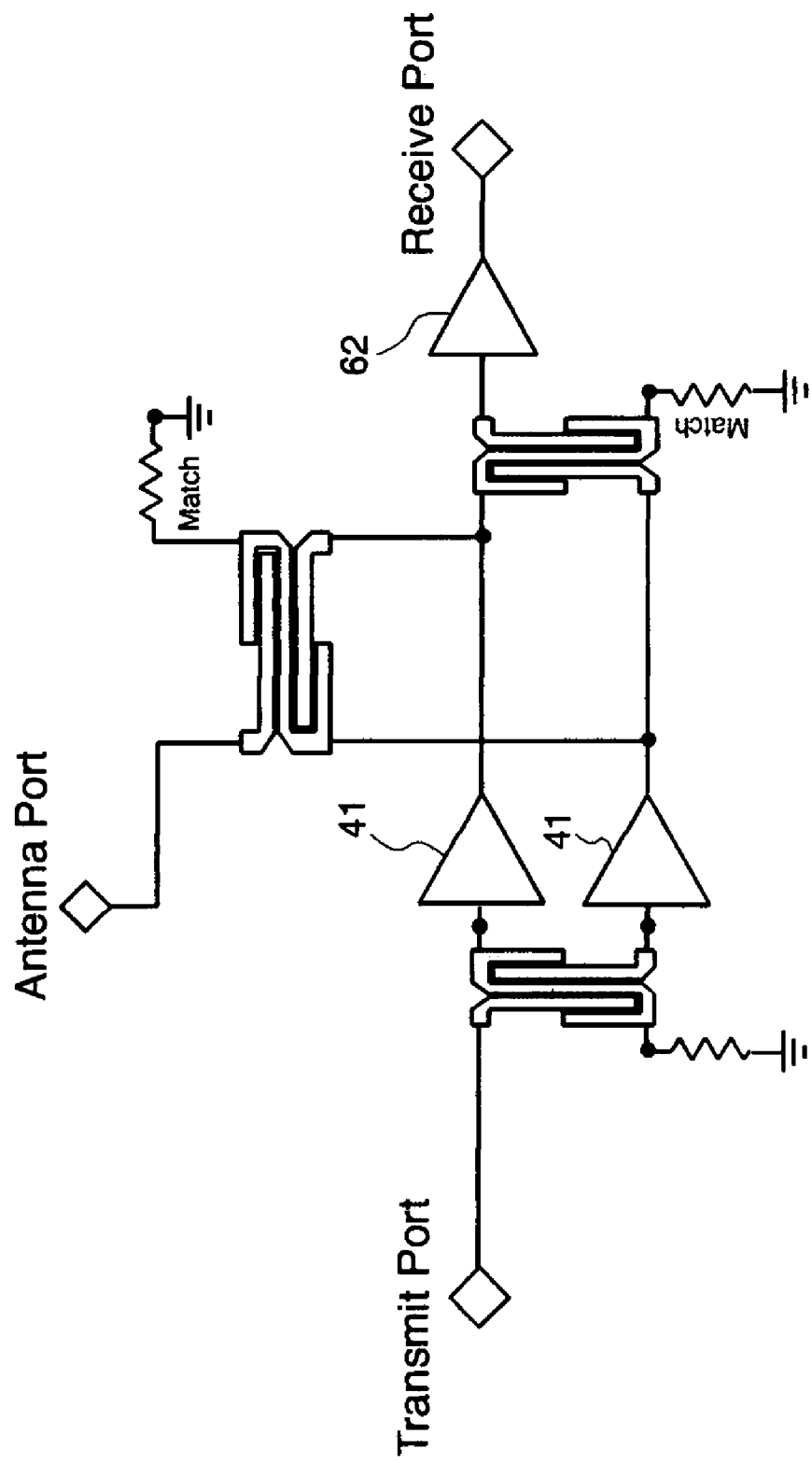
FIG. 11 is another rendition of FIG. 5 with the addition of unilateral devices after the transmit Lange couplers and a low noise amplifier before the receive port.

FIG. 11 is another embodiment wherein Lange Couplers are again used as 90 degree combiner/dividers in the circulator portion with unilateral devices placed between the transmit Lange coupler and Y-junctions A and B to prevent feedback of the antenna signal. A low noise amplifier is placed after the receive 90 degree combiner/divider and the receive port to provide greater signal strength.

Figure 12:
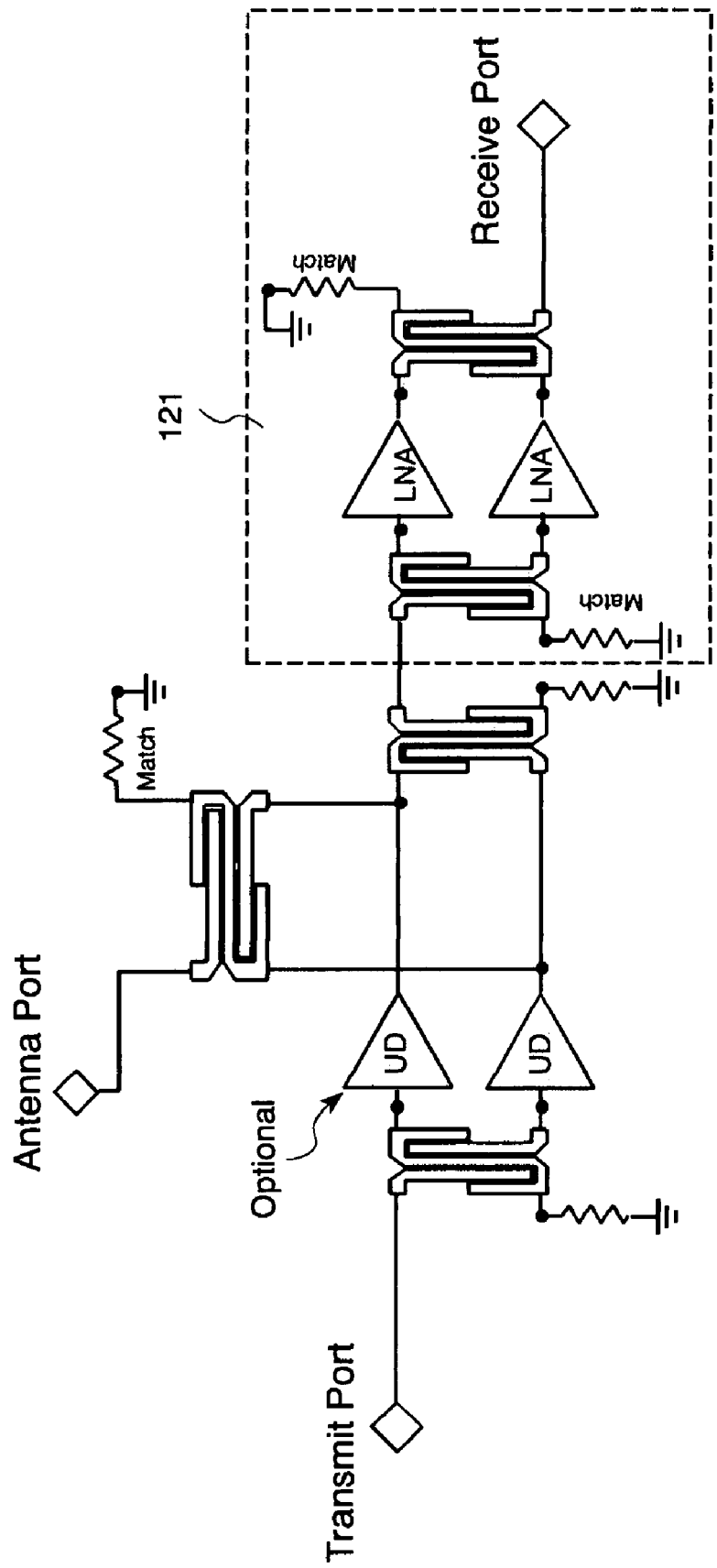
FIG. 12 is a further enhancement of FIG. 11 with a balance low noise amplifier section replacing the low noise amplifier before the receive port.

FIG. 12 embodies the circulator with Lange couplers and unilateral devices as in FIG. 10 with the addition of a balanced low noise amplifier system, 121, after the receive Lange coupler and the receive port. The advantages of this embodiment are no feed back to the transmit port and high isolation of the receive signal with no feedback from the receive port.

Figure 13:
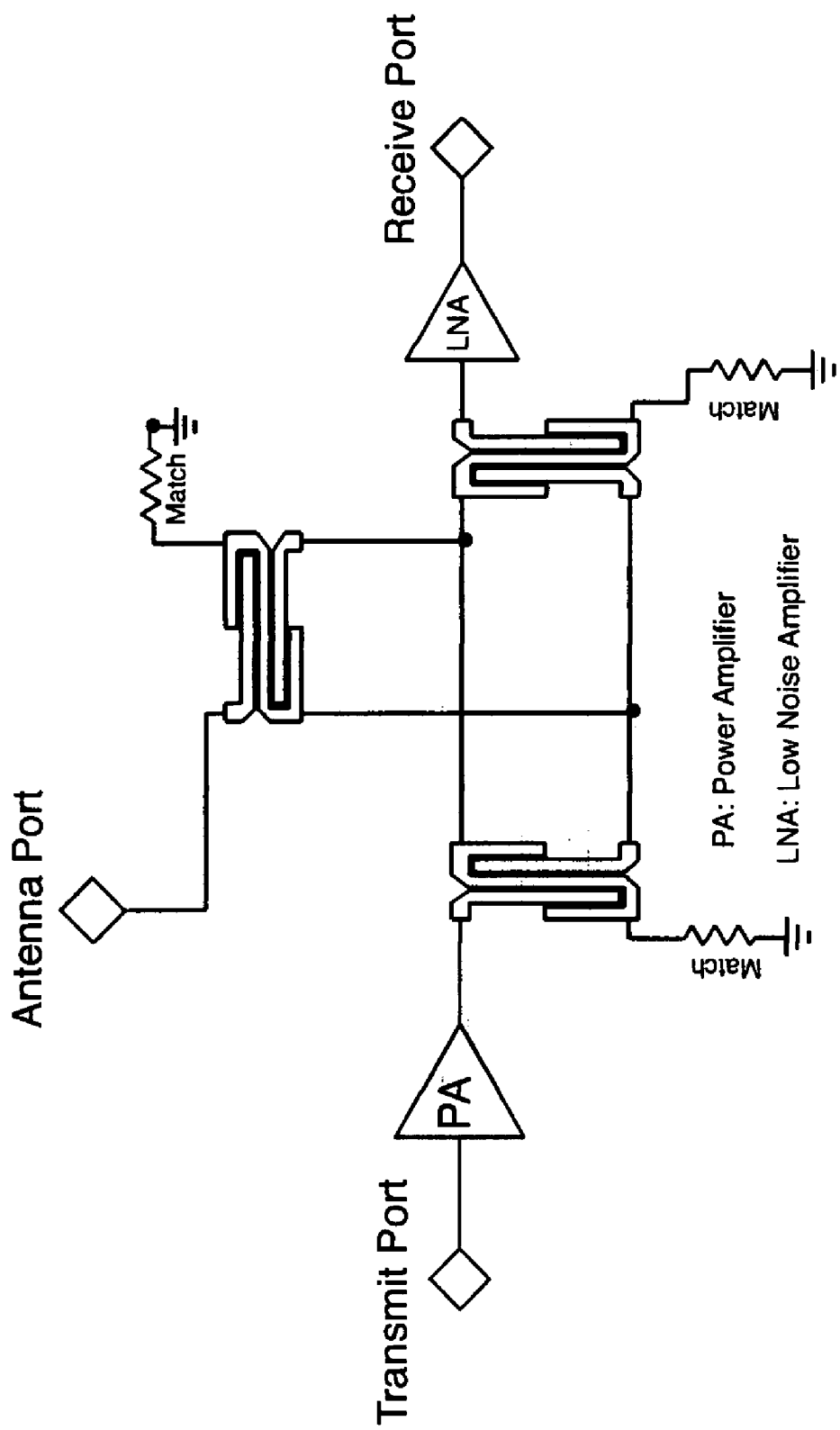
FIG. 13 is the basic structure with Lange couplers with a power amplifier between the transmit port and it Lange couple and a low noise amplifier between the receive Lange coupler and the receive port.

FIG. 13 embodies a circulator with Lange couplers with a power amplifier, PA, between the transmit port and the transmit Lange coupler for increased signal transmission and a low noise amplifier, LNA, between the receive Lange coupler and the receive port for increased receive signal.

Figure 14:
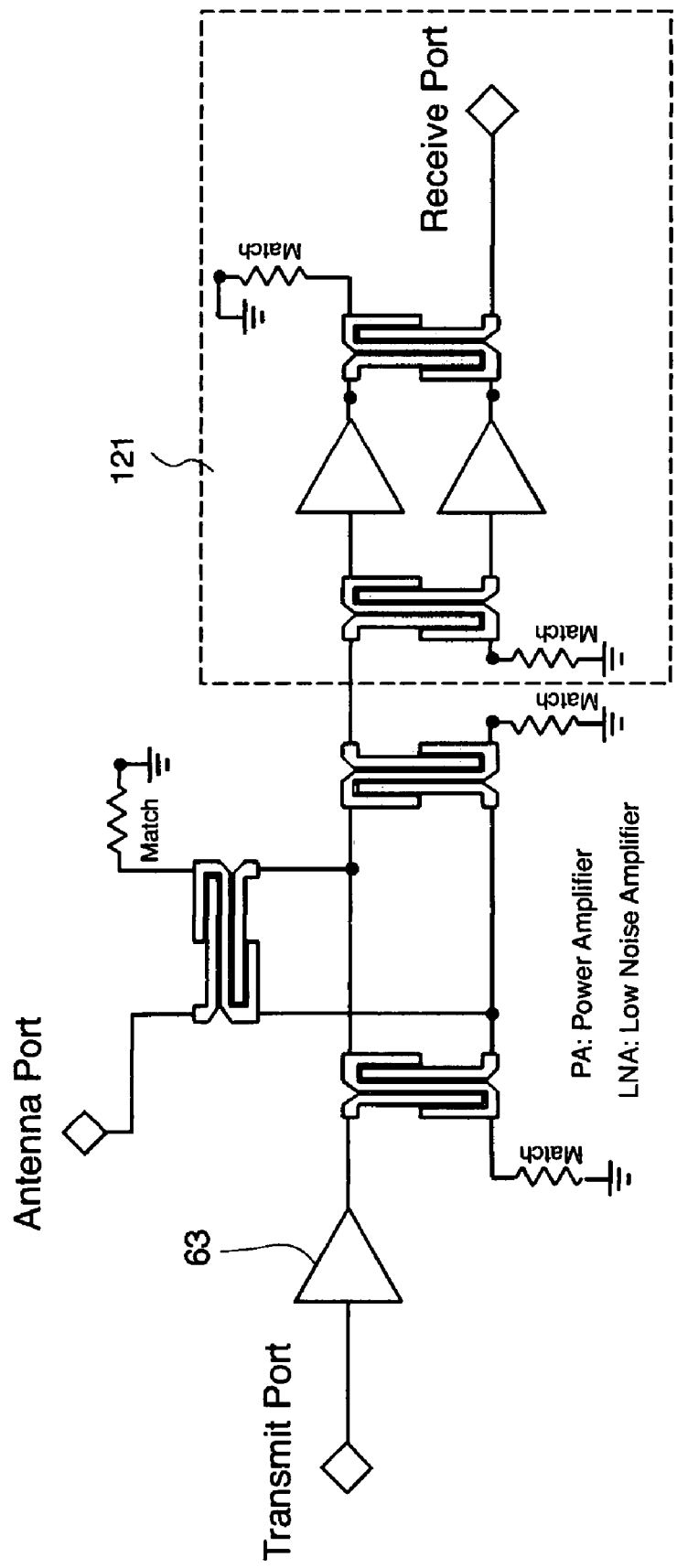
FIG. 14 is an enhancement of FIG. 13 with a balanced low noise amplifier replacing the low noise amplifier of FIG. 13.

FIG. 14 embodies the device with Lange couplers substituted for the 90 degree divider/combiners and a power amplifier, 63, between the transmit port and the transmit Lange coupler. On the receive portion of the device, a balanced low noise amplifier, 121, is placed between the receive Lange coupler and the receive port. The advantages of this arrangement is again high isolation of the receive signal and amplification of the transmit signal.

Figure 15:
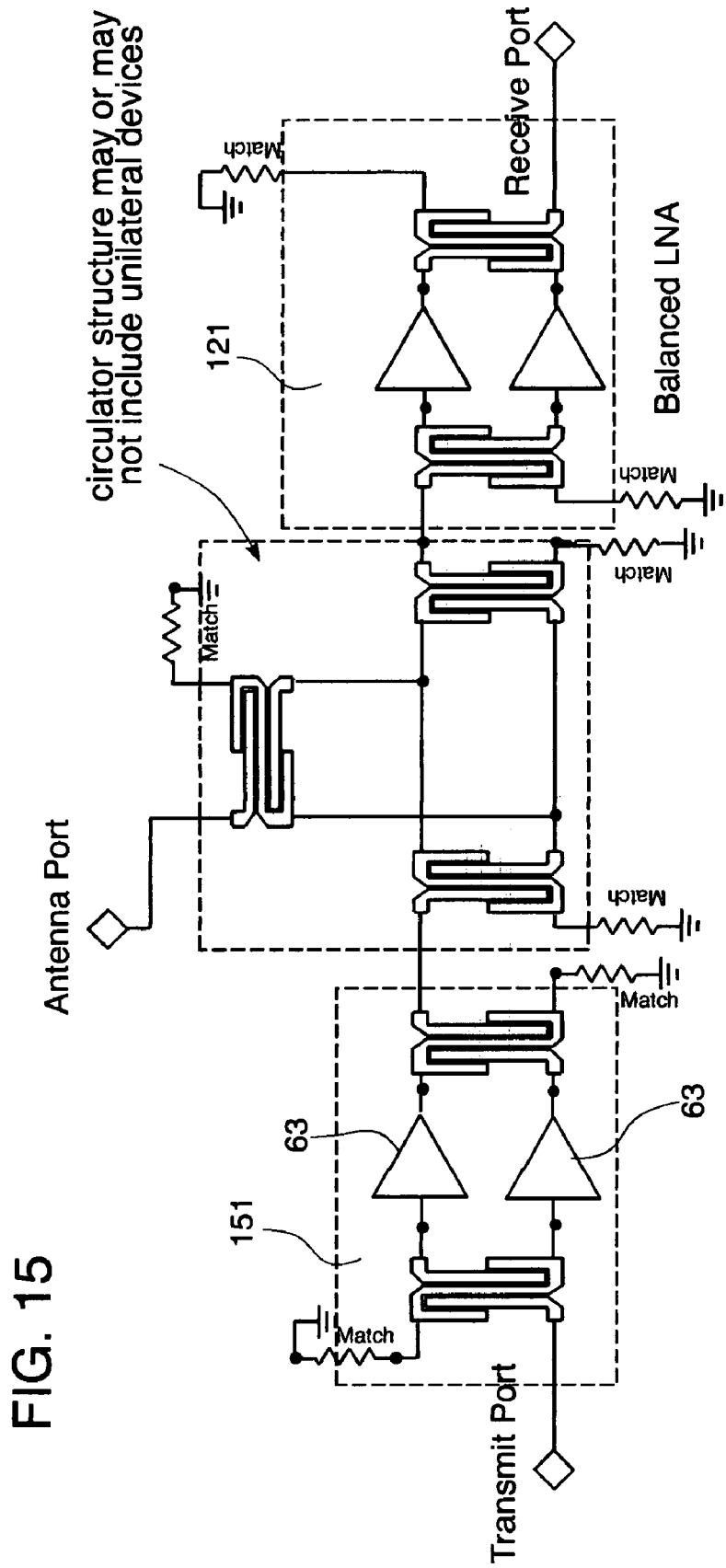
FIG. 15 is a rendition of the basic structure with Lange couplers, with a balance amplifier attached to the transmit port and a balance low noise amplifier attached to the receive port.

FIG. 15 is the embodiment that is comprised of a balance amplifier circuit, 151, placed between the transmit port and the transmit 90 degree combiner/divider. This balanced amplifier circuit is composed of two Lange couplers and two amplifiers, 63, and is designed to increase transmit signal. Also included in this embodiment is a balanced low noise amplifier, 121, that is placed after the receive 90 degree combiner/divider and the receive port. This balanced low noise amplifier is comprised of two additional Lange couplers and two low noise amplifiers and is designed to amplify the receive signal while also providing high isolation of reflected signals to the receiving port when the balanced structure is operated together with the Lange coupler at the receive port. The reflected signals from the inputs of the low noise amplifiers are routed to the isolated port of the input Lange coupler of the balanced amplifier, where the reflected power is attenuated by the resistive termination.

What is claimed is:

1. A circulator capable of simultaneous transmit and receive operations, high frequency, high isolation and broadband performance comprising:
    an antenna port;
    a transmission port;
    a receiving port;
    wherein each port is connected to a 90 degree combiner/divider for splitting an input signal into two output components, the said output components have a ninety degrees relative phase difference to each other;
    each of said 90 degree combiner/dividers in addition to the connection to the above mentioned ports has at least two output connections each of which are connected to a Y-junction and if a fourth connection, said fourth connection is attached to a matching load circuit;
    this arrangement of circuits allows the portion of the phase shifted signals from the transmit port to enter the antenna 90 degree combiner/divider and be recombined in phase at the antenna port, while the rest of the signal enters the receive 90 degree combiner/divider and are phase cancelled;
    said arrangement simultaneously allows the receive signal entering the antenna port and proceeding to the antenna 90 degree combiner/divider to enter the receive 90 degree combiner/divider and to be combined in phase at the receive port.

2. A circulator capable of simultaneous transmit and receive operations, high frequency, high isolation and broadband performance as described in claim 1 further comprising unilateral devices such as: field effect transistors, bipolar junction transistors, amplifier or any devices with high reverse isolation located between said 90 degree combiner/divider at the transmit port and said Y-junctions to prevent any signals from returning to said transmit port.

3. A circulator capable of simultaneous transmit and receive operations, high frequency, high isolation and broad band performance as described in claim 1 wherein a Lange coupler is substituted for said 90 degree divider/combiner.

4. A circulator capable of simultaneous transmit and receive operations, high frequency, high isolation and broad band performance as described in claim 1 wherein said 90 degree divider/combiner is substituted by active circuitries using field effective transistors, bipolar junction transistors, or any other MMIC devices that are similar in operation to said 90 degree combiner/divider.

5. A circulator capable of simultaneous transmit and receive operations, high frequency, high isolation and broad band performance described in claim 1 further comprising an amplifier inserted to the circuitry after the transmit port but before the 90 degree combiner/divider.

6. A circulator capable of simultaneous transmit and receive operations, high frequency, high isolation and broad band performance described in claim 1 further comprising an amplifier inserted to the circuitry after the transmit port but before the 90 degree combiner/divider and a unilateral device inserted after the 90 degree combiner/divider, but before the Y-junction.

7. A circulator capable of simultaneous transmit and receive operations, high frequency, high isolation and broad band performance described in claim 1 further comprising an balanced amplifier inserted to the circuitry after the transmit port but before the said transmit 90 degree combiner/divider.

8. A circulator capable of simultaneous transmit and receive operations, high frequency, high isolation and broad band performance described in claim 1 further comprising a low noise amplifier inserted into the circuitry between the receive said receive 90 divider/combiner and the receive port.

9. A circulator capable of simultaneous transmit and receive operations, high frequency, high isolation and broad band performance described in claim 1 further comprising a balanced low noise amplifier inserted into the circuitry between said receive 90 divider/combiner and said receive port.

10. A circulator capable of simultaneous transmit and receive operations high frequency and broad band performance as described in claim 1 further comprising a forward cancellation circuit and a low noise amplifier;
    said forward cancellation circuit is connected to said circulator by couplers;
    the first of said couplers is located between the amplifier and the transmit port;

the other of said couplers is located between the receive port and the input port of said low noise amplifier;

said forward cancellation circuit is also comprised of an attenuator.

11. A circulator capable of simultaneous transmit and receive operations, high frequency, and broad band performance as described in claim 1 further comprising an amplifier after the transmit port but before the 90 degree divider/combiner and a low noise amplifier after the receive 90 degree divider/combiner but before the receive port.

12. A circulator capable of simultaneous transmit and receive operations, high frequency, and broad band performance as described in claim 1 further comprising an amplifier after the transmit port but before the 90 degree divider/combiner and a balanced low noise amplifier after the receive 90 degree divider/combiner but before the receive port; said balanced low noise amplifier includes Lange couplers.

13. A circulator capable of simultaneous transmit and receive operations, high frequency, and broad band performance as described in claim 1 further comprising a balanced amplifier after the transmit port but before the 90 degree divider/combiner and a balanced low noise amplifier after the receive 90 degree divider/combiner but before the receive port; said balanced amplifier includes balance structure that uses Lange couplers; said balanced low noise amplifier includes balance structure that uses Lange couplers; said device may or may not include unilateral devices.

* * * * *

UNITED STATES PATENT AND TRADEMARK OFFICE
CERTIFICATE OF CORRECTION

| | | |
|---|---|---|
| PATENT NO. | : 7,541,890 B2 | |
| APPLICATION NO. | : 11/978252 | |
| DATED | : June 2, 2009 | |
| INVENTOR(S) | : Chueng, Halloran and Weedon | |

It is certified that error appears in the above-identified patent and that said Letters Patent is hereby corrected as shown below:

Col. 1, lines 3-4 should read,
This invention was made with Government support under contract number W31P4Q-06-C-0076 awarded by DAARPA. The Government has certain rights in the invention.

Signed and Sealed this
First Day of March, 2011

David J. Kappos
*Director of the United States Patent and Trademark Office*